United States Patent [19]
Kanoh

[11] Patent Number: 5,274,373
[45] Date of Patent: Dec. 28, 1993

[54] DIGITAL ANALOG CONVERTER

[75] Inventor: Kenji Kanoh, Itami, Japan

[73] Assignee: Mitsubishi Denki Kabushiki Kaisha, Tokyo, Japan

[21] Appl. No.: 838,939

[22] Filed: Feb. 21, 1992

[30] Foreign Application Priority Data

May 21, 1991 [JP] Japan .................................. 3-115117

[51] Int. Cl.[5] .................... H03M 1/06; H03M 1/72
[52] U.S. Cl. ................................ 341/118; 341/144; 341/146; 341/154
[58] Field of Search ............... 341/118, 144, 154, 126, 341/146

[56] References Cited

U.S. PATENT DOCUMENTS

| | | |
|---|---|---|
| 3,982,172 | 9/1976 | van de Plassche . |
| 3,995,304 | 11/1976 | Pease . |
| 4,062,013 | 12/1977 | Nagahama . |
| 4,146,882 | 3/1979 | Hoff, Jr. et al. . |
| 4,658,240 | 4/1987 | Bixby . |
| 4,695,826 | 9/1987 | Audo et al. ........................ 341/118 |
| 4,791,406 | 12/1988 | Mehrgardt et al. ................. 341/144 |
| 4,812,818 | 3/1989 | Colles ............................. 341/118 X |
| 5,084,701 | 1/1992 | Sauerwald ........................ 341/118 |

Primary Examiner—Sharon D. Logan
Attorney, Agent, or Firm—Oblon, Spivak, McClelland, Maier & Neustadt

[57] ABSTRACT

A digital/analog converter including four D/A conversion.

The D/A convertor comprises four D/A conversion parts (DA1) to (DA4). On a single semiconductor chip the D/A convertion parts (DA1) to (DA4) are arranged so that the D/A conversion parts (DA1) and (DA3) are symmetric with respect to a first center line (L1), the first and fourth D/A conversion parts (DA1) and (DA4) are arranged symmetric with respect to a second center line (L2) which crosses the first center line (L1) at right angles and the second and third D/A conversion parts are arranged symmetric with respect to the second center line. Although the locations of the resistances of each of the conversion parts produces errors, these cancel each other out due to their arrangement.

3 Claims, 7 Drawing Sheets

DIGITAL ANALOG CONVERTER

BACKGROUND OF THE INVENTION

Field of the Invention

The present invention relates to a digital/analog converter which consists of a plurality of digital/analog parts and has improved D/A conversion accuracy.

Prior Art

Figure 5:
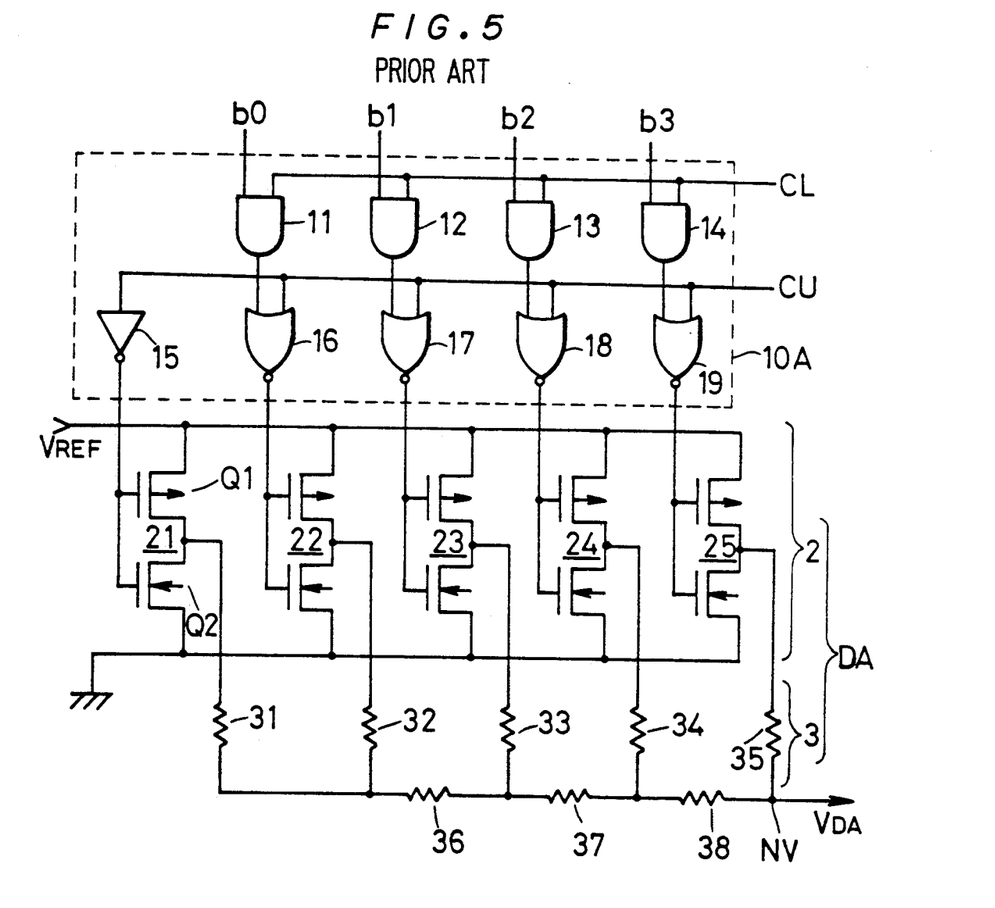
FIG. 5 is a circuit diagram showing structure of a D/A conversion part comprised in a conventional D/A convertor.
Figure 6:
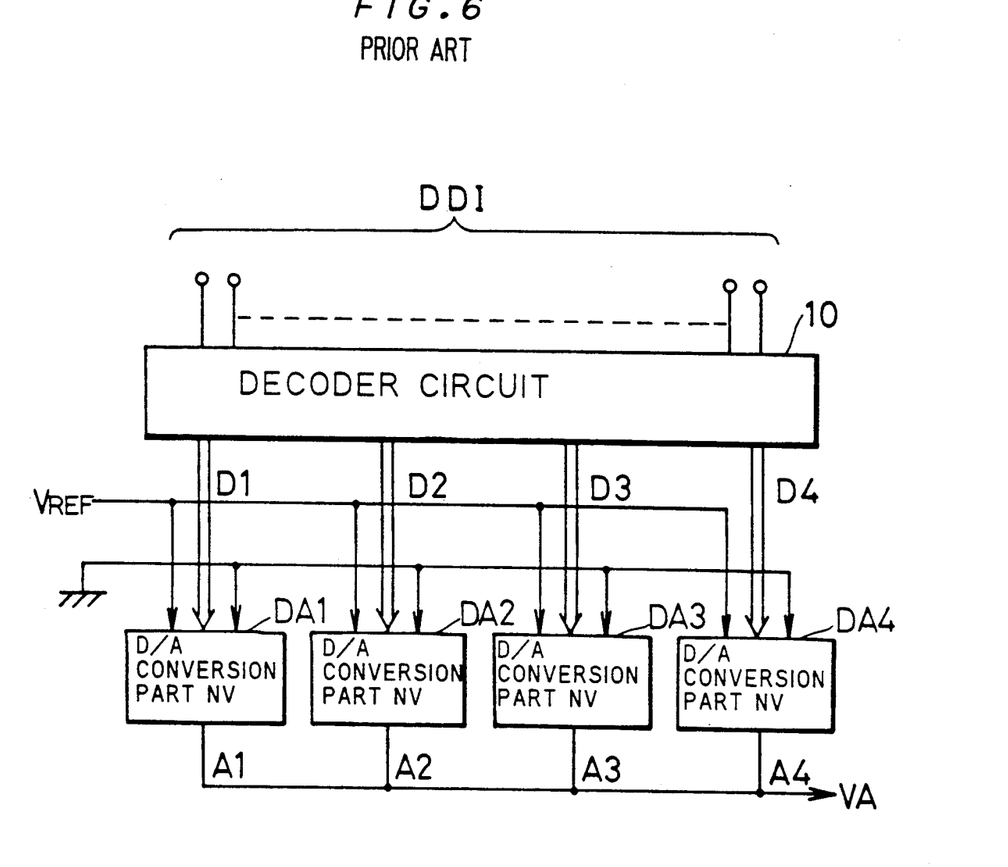
FIG. 6 is a circuit diagram showing structure of a D/A convertor comprises the conversion part of FIG. 5.

FIG. 5 is a circuit diagram showing inner structure of one of four digital/analog conversion parts DA1 to DA4 which constitute a conventional D/A convertor shown in FIG. 6. As shown in FIG. 5, a D/A conversion part DA (DA1 to DA4) comprises a switch part 2 and a resistor part 3. The D/A conversion part DA outputs an analog output $V_{DA}$ in accordance with an output from a decoder part 10A. The decoder part 10A comprises AND gates 11 to 14, an invertor 15 and NOR gates 16 to 19. As one of two input signals to be supplied, digital signals b0 to b3 are given to the AND gates 11 to 14, respectively. As the other input signal, a digital control signal CL is given commonly to the AND gates 11 to 14. In response, the AND gates 11 to 14 output signals which are given to the NOR gates 16 to 19, the output signals from the AND gates 11 to 14 being one of two input signals to be supplied to the NOR gates 16 to 19. As the other input signal, a digital control signal CU is given commonly to the NOR gates 16 to 19. On the other hand, a digital signal CU is given to the invertor 15. Then, output signals from the invertor 15 and the NOR gates 16 to 19 are given to the swtich part 2.

The switch part 2 comprises invertors 21 to 25 each inserted between a reference voltage $V_{REF}$ and a ground level. To the invertors 21 to 25, each formed by a P channel transistor Q1 and an N channel transistor Q2 connected in series, outputs from the invertor 15 and the NOR gates 16 to 19 of the decoder part 1 are given. Outputs from the invertors 21 to 25 are then given to the resistor part 3.

The resistor part 3 comprises resistors 31 to 35 each having a resistance value of 2R (R=reference resistance value) and resistors 36 to 38 each having a resistance value of R. One ends of the resistors 31 to 35 are connected with the output terminals of the invertors 21 to 25 of the switch part 2, respectively. A resistor 36 is inserted between the other ends of the resistors 32 and 33. So is a resistor 37 between the other ends of the resistors 33 and 34 and a resistor 38 between the other ends of the resistors 34 and 35. An electric potential $V_{DA}$ outputted at an output node NV between the resistors 35 and 38 becomes an electric potential which is D/A converted in accordance with the digital control signals CL and CU. More precisely, when the digital control signals CL and CU are both "0," all outputs from the invertors 21 to 25 will be grounded regardless of the values of the digital signals b0 to b3. When the digital control signals CL and CU are "1" and "0," respectively, only an output from the invertor 21 will be grounded and outputs from the invertors 22 to 25 will be determined depending on whether the digital signals b0 to b3 are at "H" level or at "L" level, respectively. When the digital control signal CL and CU are both "1," all outputs from the invertors 21 to 25 will be a reference voltage $V_{REF}$.

In the D/A conversion parts DA1 to DA4, the control signals CL and CU are signals determined by high order bits b4 and b5 of the digital signals as shown in Table 1. Hence, in accordance with the digital signals b5 to b0, analog outputs of the D/A conversion parts DA1 to DA4 become full scale one after another, the sequence being the analog output of said first D/A conversion part first, that of said second D/A conversion part next, that of said third D/A conversion part, and finally that of said fourth D/A conversion part.

TABLE 1

|    |     | b4 = 0<br>b5 = 0 | b4 = 1<br>b5 = 0 | b4 = 0<br>b5 = 1 | b4 = 1<br>b5 = 1 |
|----|-----|---|---|---|---|
| CL | DA1 | 1 | 1 | 1 | 1 |
|    | DA2 | 0 | 1 | 1 | 1 |
|    | DA3 | 0 | 0 | 1 | 1 |
|    | DA4 | 0 | 0 | 0 | 1 |
| CU | DA1 | 0 | 1 | 1 | 1 |
|    | DA2 | 0 | 0 | 1 | 1 |
|    | DA3 | 0 | 0 | 0 | 1 |
|    | DA4 | 0 | 0 | 0 | 0 |

Figure 7:
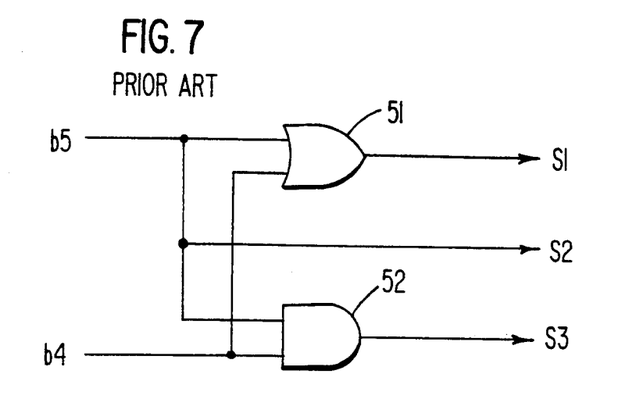
FIG. 7 is a circuit diagram showing a decode part connected with a conventional D/A conversion part.

FIG. 7 is a circuit diagram showing the inner structure of a decode circuit which decodes the digital control signals b5 and b6 (Table 1) to generate and output digital control signals CL and CU. As shown in FIG. 7, the decode circuit comprises an OR gate 51 and an AND gate 52. One of two inputs to be given to both the OR gate 51 and the AND gate 52 is the digital signal b4. The other input to be given to the OR gate 51 and the AND gate 52 is the digital signal b5. An output from the OR gate 51 becomes a control signal S1. The digital signal b5 becomes a control signal S2. An output from the AND gate 52 becomes a control signal S3.

The control signal S1 is both a digital control signal CU to be given to the D/A conversion part DA1 and a digital control signals CL to be given to the D/A conversion part DA2. The control signal S2 is both a digital control signal CU to be given to the D/A conversion part DA2 and a digital control signal CL to be given to the D/A conversion part DA3. The control signal S3 is both a digital control signal CU to be given to the D/A conversion part DA3 and a digital control signal CL to be given to the D/A conversion part DA4. The digital control signal CL for the D/A conversion part DA1 is always "1." Hence, the AND gates 11 to 14 (decoder part 1: FIG. 5) connected with the D/A conversion part DA1 may be omitted so that the digital signals b0 to b3 are directly supplied to the NOR gates 16 to 19. On the other hand, the digital control signal CU for the D/A conversion part DA4 is always "0." Therefore, the invertor 15 and the NOR gates 16 to 19 (decoder part 1) connected to the D/A conversion part DA4 may be omitted, and a ground level may be given to the invertor 21 to be used instead of the invertor 15 and invertors to which outputs from the AND gates 11 to 14 are given may be used instead of the NOR gates 16 to 19.

The output voltage $V_{DA}$ from the D/A conversion part DA as above is determined as:

$$V_{DA} = \frac{V_{REF}}{2^4} \times (2^3 \cdot b3 + 2^2 \cdot b2 + 2^1 \cdot b1 + 2^0 \cdot b01 + 2^0 \cdot b00)$$

where b00 denotes "1" (H) and "0" (L) of an output from the invertor 21, b01 denotes "1" and "0" of an output from the invertor 22, b1 denotes "1" and "0" of an output from the invertor 23, b2 denotes "1" and "0" of an output from the invertor 24, and b3 denotes "1" and "0" of an output from the invertor 25.

FIG. 6 is an explanatory diagram showing structure of a D/A convertor formed by four D/A conversion parts DA1 to DA4 of FIG. 5 connected in parallel. As shown in FIG. 6, a decoder circuit 10 decodes digital signals DDI (b5 to b0) given thereto in order to generate and give decode signals D1 to D4 to the D/A conversion parts DA1 to DA4, respectively. The decoder circuit 10 incorporates the decode part 1 shown in FIG. 5 and the decode part shown in FIG. 7.

On the other hand, the D/A conversion parts DA1 to DA4, to which the reference voltage $V_{REF}$ and a ground level are given, perform DD conversion in accordance with the decode outputs D1 to D4 from the decoder circuit 10. Parallel connection of the D/A conversion parts DA1 to DA4 is attained by connecting the output nodes NV of the D/A conversion parts commonly. Hence, assuming that output resistances of the D/A conversion parts DA1 to DA4 are commonly and uniformly R, an analog output VA of the D/A convertor is determined as:

$$VA = \frac{1}{4} \cdot \frac{V_{REF}}{2^4} \cdot$$

$$[(8 \cdot b3_1 + 4 \cdot b2_1 + 2 \cdot b1_1 + b01_1 + b00_1) +$$

$$(8 \cdot b3_2 + 4 \cdot b2_2 + 2 \cdot b1_2 + b01_2 + b00_2) +$$

$$(8 \cdot b3_3 + 4 \cdot b2_3 + 2 \cdot b1_3 + b01_3 + b00_3) +$$

$$(8 \cdot b3_4 + 4 \cdot b2_4 + 2 \cdot b1_4 + b01_4 + b00_4)]$$

Where $b00_1$ to $b00_4$ denote "1" (H) and "0" (L) of outputs from the invertors 21 in the D/A conversion parts DA1 to DA4, respectively; $b01_1$ to $b01_4$ denote "1" and "0" of outputs from the invertors 22 in the D/A conversion parts DA1 to DA4, respectively; $b1_1$ to $b1_4$ denote "1" and "0" of outputs from the invertors 23 in the D/A conversion parts DA1 to DA4, respectively; $b2_1$ to $b2_4$ denote "1" and "0" of outputs from the invertors 24 in the D/A conversion parts DA1 to DA4, respectively; and $b3_1$ to $b3_4$ denote "1" and "0" of outputs from the invertors 25 in the D/A conversion parts DA1 to DA4, respectively.

Figure 8:
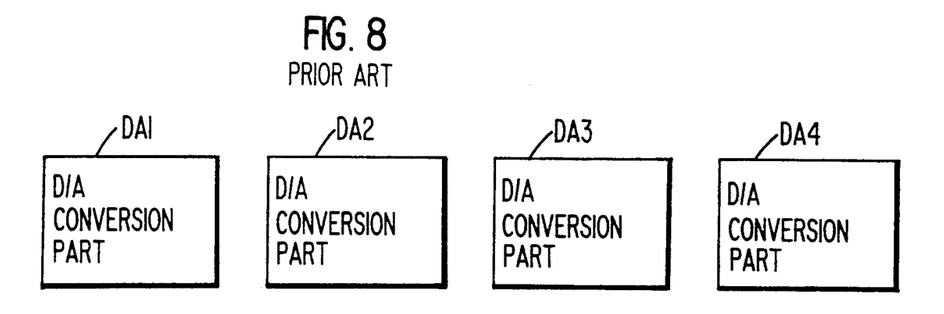
FIG. 8 is a plane view showing an arrangement of D/A conversion parts within the conventinal D/A convertor

FIG. 8 is a plane view showing how the D/A conversion parts DA1 to DA4 of the D/A convertor of FIG. 6 are acutually arranged on a semioconductor chip. As shown in FIG. 8, the D/A conversion parts DA1 to DA4 are arranaged in a file.

The D/A conversion parts DA1 to DA4 have an disadvantage as follows. Even if formed by patterns with exactly the same configuration, the D/A conversion parts DA1 to DA4 would have slightly different characteristics. Because of different locations on a semiconductor chip, diffusion and exposure during fabrication differ between the D/A conversion parts. So does stress from resin during mold packaging. Local temperatures within the semiconductor chip vary as well. When the D/A conversion parts DA1 to DA4 have different characteristics, output resistance values R1 to R4 would not be exactly the reference resistance value R. As a result, the analog output VA from the D/A convertor comprising the D/A conversion parts DA1 to DA4 (FIG. 6) would be $$VA = \frac{V_{REF}}{2^4} \times$$

$$[@R1 \cdot (8 \cdot b3_1 + 4 \cdot b2_1 + 2 \cdot b1_1 + b01_1 + b00_1) +$$

$$@R2 \cdot (8 \cdot b3_2 + 4 \cdot b2_2 + 2 \cdot b1_2 + b01_2 + b00_2) +$$

$$@R3 \cdot (8 \cdot b3_3 + 4 \cdot b2_3 + 2 \cdot b1_3 + b01_3 + b00_3) +$$

$$@R4 \cdot (8 \cdot b3_4 + 4 \cdot b2_4 + 2 \cdot b1_4 + b01_4 + b00_4)]$$

$$@R1 = \frac{R2 \| R3 \| R4}{R1 + R2 \| R3 \| R4} \qquad @R2 = \frac{R3 \| R4 \| R1}{R2 + R3 \| R4 \| R1}$$

$$@R3 = \frac{R4 \| R1 \| R2}{R3 + R4 \| R1 \| R2} \qquad @R4 = \frac{R1 \| R2 \| R3}{R4 + R1 \| R2 \| R3}$$

where $X \| Y \| Z$ is a parallel combined resistance of X, Y and Z. For example, $R2 \| R3 \| R4$ is a parallel combined resistance of output resistances R2 to R4 at the D/A conversion parts DA2 to DA4.

Now, in order to examine conversion accuracy of the D/A convertor of FIG. 6, assume that 2-bit data DDI(b5 to b0) are determined so that analog outputs of the D/A conversion parts DA1 and DA2 become full scale and analog outputs of the D/A conversion parts DA3 and DA4 become "0." In this case, although an ideal intermediate potential as the analog output VA of the D/A convertor is $V_{REF}/2$, the analog output VA includes an intermediate error $\Delta VA$ from the ideal potential $V_{REF}/2$.

$$\Delta VA = V_{REF} \times \frac{R2 \| R3 \| R4}{R1 + R2 \| R3 \| R4} + \frac{R3 \| R4 \| R1}{R2 + R3 \| R4 \| R1} - \frac{1}{2}$$

For each of the D/A conversion parts DA1 to DA4, an amount of variation in characteristics and a location on the semiconductor chip has a relation represented by a linear function. Where the output resistance value of the D/A conversion part DA1 is R, that of the D/A conversion part DA2 is $R(1+\Delta(<<))$, that of the D/A conversion part DA3 is $R(1+2)$ and that of the D/A conversion part DA4 is $R(1+3\Delta)$. In this case, @R1 and @R2 are:

$$@R1 = \frac{R2 \| R3 \| R4}{R1 + R2 \| R3 \| R4} = \frac{1}{4} \cdot \left(1 + \frac{3}{2} \Delta \right)$$

$$@R2 = \frac{R3 \| R4 \| R1}{R2 + R3 \| R4 \| R1} = \frac{1}{4} \cdot \left(1 + \frac{\Delta}{2} \right)$$

Hence, the intermediate error $\Delta VA$ is $$\Delta V_{DA} = \frac{\Delta}{2} \cdot V_{REF}$$

As heretofore described, a conventional D/A convertor consists of a plurality of D/A conversion parts has a disadvantage. Because of differences in location on a semiconductor chip, the D/A conversion parts have different characteristics. As a result, an error is included in the analog output of the D/A convertor. Due to the error, the D/A convertor cannot perform accurate D/A conversion.

The present invention has been made to deal with this problem. The object of the present invention is to obtain a D/A convertor consists of a plurality of D/A conversion parts which performs accurate D/A conversion.

SUMMARY OF THE INVENTION

The present invention is directed to a D/A convertor for D/A converting digital signals to output an analog signal. A D/A convertor according to one aspect of the present invention comprises first to fourth D/A conversion parts, analog outputs generated by the first to fourth D/A conversion parts in accordance with the digital signals becoming full scale one after another, the sequence being the analog output of the first D/A conversion part first, that of the second D/A conversion part next, that of the third D/A conversion part, and finally that of the fourth D/A conversion part, the D/A convertor being characterized by an arrangement of the D/A conversion parts on a semiconductor chip that the first and third D/A conversion parts are arranged symmetric with respect to a first center line, the first and fourth D/A conversion parts are arranged symmetric with respect to a second center line which crosses the first center line at right angles and the second and third D/A conversion parts are arranged symmetric with respect to the second center line.

A D/A convertor according to another aspect of the present invention comprises first to fourth D/A conversion parts each including a resistor part, analog outputs generated by the first to the fourth D/A conversion parts in accordance with the digital signals becoming full scale one after another, the sequence being the analog output of the first D/A conversion part first, that of the second D/A conversion part next, that of the third D/A conversion part, and finally that of the fourth D/A conversion part, the D/A convertor being characterized by an arrangement of the D/A conversion parts on a semiconductor chip that the resistor parts of the first and third D/A conversion parts are arranged symmetric with respect to a first center line, the resistor parts of the first and fourth D/A conversion parts are arranged symmetric with respect to a second center line which crosses the first center line at right angles and the resistor parts of the second and third D/A conversion parts are arranged symmetric with respect to the second center line.

Accordingly, it is a major object of the present invention to provide a digital/analog converter in which errors in output resistances the first to fourth D/A conversion parts due to the different locations of the first to fourth D/A conversion parts on the semiconductor chip cancel each other, thereby an accurate analog signal is obtained.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
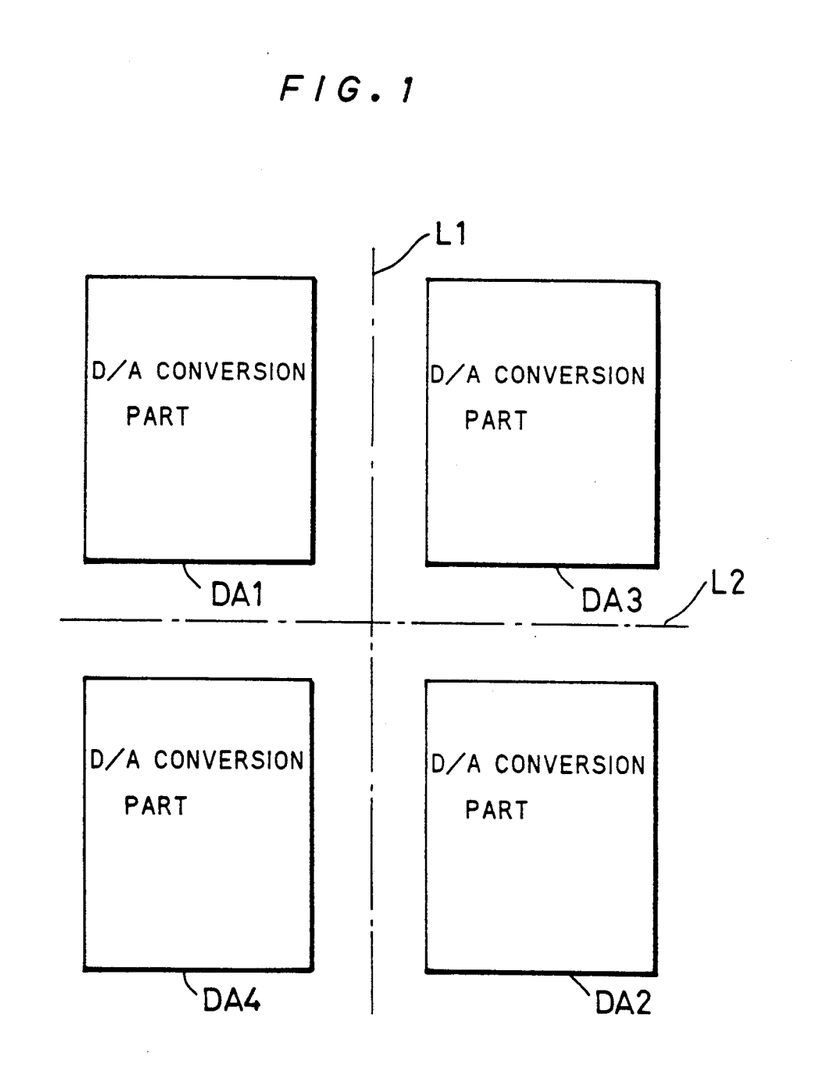
FIG. 1 is a plane view showing an arrangement of D/A conversion parts within a D/A convertor according to an embodiment of the present invention.

FIG. 1 is a plane view showing an arrangement of four D/A conversion parts within a D/A convertor according to an embodiment of the present invention. As shown in FIG. 1, a D/A convertor is formed by four D/A conversion parts DA1 to DA4. The D/A conversion parts DA1 to DA4, each having the same structure as that of the conventional D/A conversion part of FIG. 5, are the parallel resistance type.

On a semiconductor chip, the D/A conversion parts DA1 to DA4 are arranged as follows. The D/A conversion parts DA1 and DA3 are symmetric with respect to a first center line L1. The D/A conversion parts DA1 and DA4 are symmetry with respect to a second center line L2 which crosses with the first center line L1 at right angles. The D/A conversion parts DA2 and DA3 are symmetry with respect to the second center line L2. Thus, the D/A conversion parts DA2 and DA4 are symmetry with respect to the first center line L1. Such an arrangement of the D/A conversion parts DA1 to DA4 will be termed simply as "symmetric arrangement" in the present invention.

Figure 2:
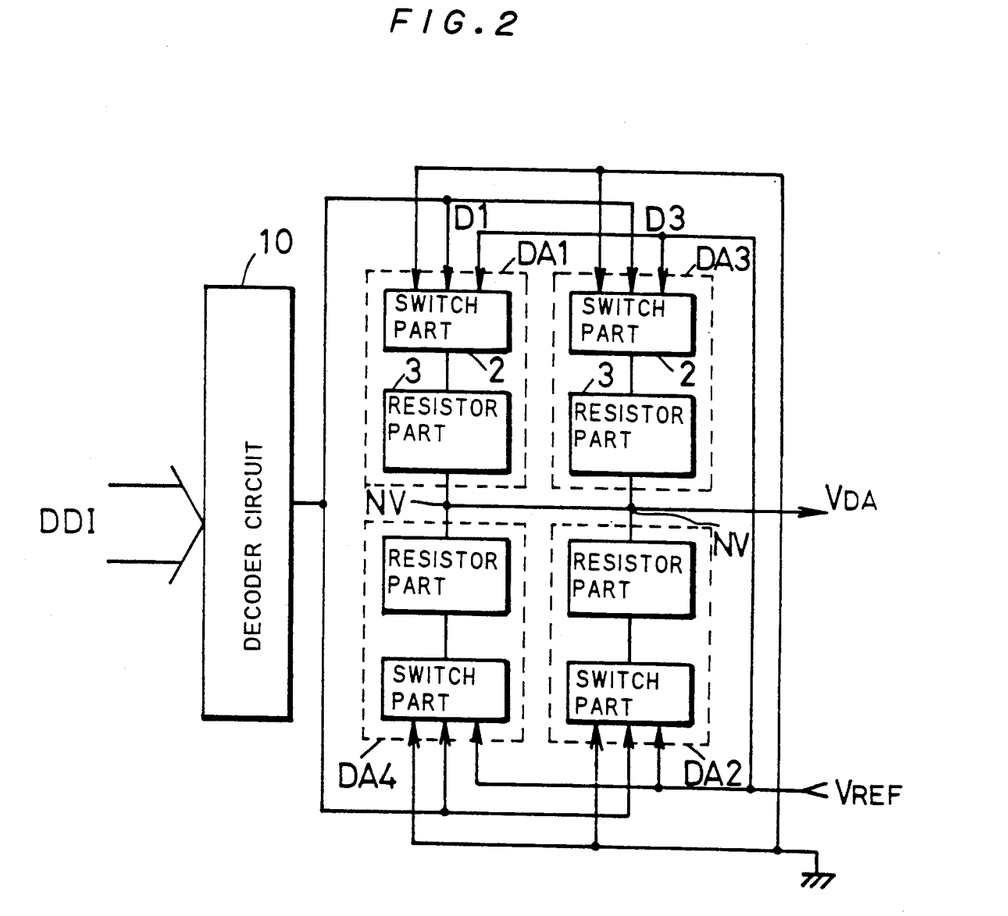
FIG. 2 is an explanatory diagram illustrating detailed inner structure of the D/A convertor of FIG. 1.

FIG. 2 is an explanatory diagram showing circuit structure of the D/A convertor of FIG. 1. As shown in FIG. 2, a decoder circuit 10 receives a digital signal DDI in accordance with which decoding is performed to generate and give decode signals D1 to D4 to the D/A conversion parts DA1 to DA4, respectively.

The D/A conversion parts DA1 to DA4 are also provided with a reference voltage $V_{REF}$ and a ground level. In accordance with the decode output signals D1 to D4 given thereto, the D/A conversion parts DA1 to DA4 perform D/A conversion. Parallel connection of the D/A conversion parts DA1 to DA4 is attained by commonly connecting the output nodes NV of the D/A conversion parts DA1 to DA4. Similarly to the conventional D/A conversion parts, analog outputs of the D/A conversion parts DA1 to DA4 become full scale one after another, the sequence being the analog output of said first D/A conversion part first, that of said second D/A conversion part next, that of said third D/A conversion part, and finally that of said fourth D/A conversion part.

As described earlier, for each of the D/A conversion parts DA1 to DA4, a relation between a variation amount in characteristics and a location on a semiconductor chip can be represented by a linear function. Now assume here that the first center line L1 is a y-axis, the second center line L2 is an x-axis, an infinitesimal variation amount due to a difference in location in the x-direction is $\Delta x (<<1)$ and an infinitesimal variation amount due to a difference in location in the y-direction $\Delta y (<<1)$. If the output resistance R1 of the D/A conversion part DA1 is R, the output resistance R3 of the D/A conversion part DA3 is R(1+Δy) and the output resistance R2 of the D/A conversion part DA2 is R(1+Δx+Δy). In this case, @R1 and @R2 are:

$$@R1 = \frac{R2 \| R3 \| R4}{R1 + R2 \| R3 \| R4} = \frac{1}{4} \cdot \left\{ 1 + \frac{1}{2}(\Delta x + \Delta y) \right\}$$

$$@R2 = \frac{R3 \| R4 \| R1}{R2 + R3 \| R4 \| R1} = \frac{1}{4} \cdot \left\{ 1 - \frac{1}{2}(\Delta x + \Delta y) \right\}$$

Hence, an intermediate error ΔVA is
VA=0

Thus, variations among the output resistances R1 to R4 caused by different locations of the D/A conversion parts DA1 to DA4 on the semiconductor chip cancell with each other. Hence, an error would not occur in the analog output VA of the D/A convertor.

A major cause of variations in the output resistances of the conversion parts DA1 to DA4 lies in a resistor part 3. Hence, by mounting at least resistor parts 3 of the D/A conversion parts DA1 to DA4 in the symmetric arrangement, an error in the analog output VA can be reduced.

In the above arrangement of the resistor parts 3, it is desirable to arrange the resistor parts 3 close each other. Close arrangement of resistor parts 3 enables reduction in variations among the output resistances R1 to R4. When the variations are reduced, an error in the analog output VA is reduced accordingly.

Figure 3:
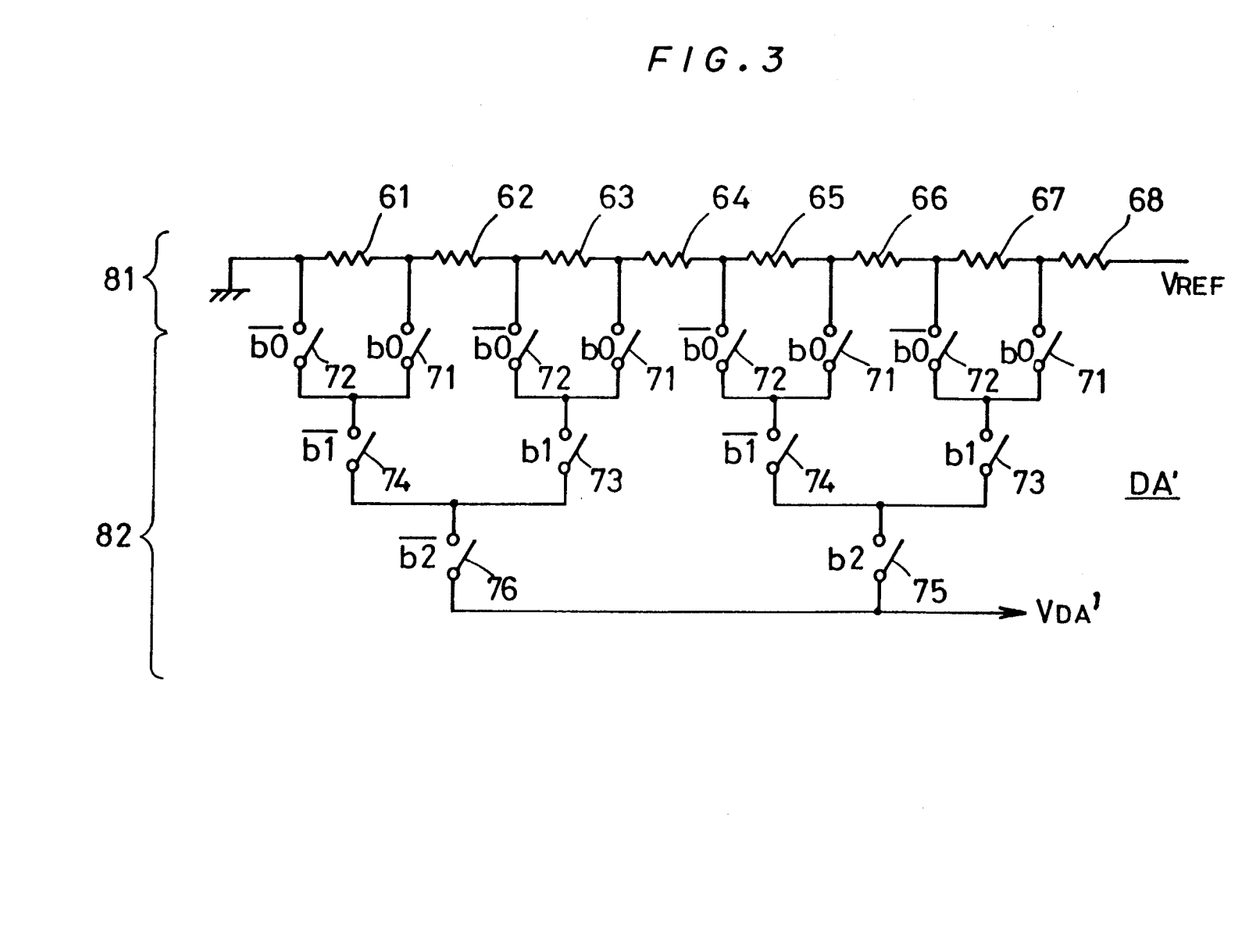
FIG. 3 is a circuit diagram showing other D/A conversion part.

In the presently preferred embodiment of the invention heretofore described, the D/A conversion parts DA1 to DA4 have their resistors connected in parallel. However, the resistors may be connected in series as shown in FIG. 3. The reference numerals and symbols in FIG. 3 are as follows: 61 68 . . . resistors having a resistance value of R; 71 . . . analog switch which turns on and off in accordance with a digital signal b0; 72 . . . analog switch which turns on and off in accordance with a reverse digital signal bar b0; 73 . . . analog switch which turns on and off in accordance with a digital signal b1; 74 . . . analog switch which turns on and off in accordance with a reverse digital signal bar b0; 75 . . . analog switch which turns on and off in accordance with a digital signal b2; 76 . . . analog switch which turns on and off in accordance with a reverse digital signal bar b0. The resistors 61 to 68 constitute a resistor part 81 and the analog switches 71 to 76 constitute a switch part 82.

In such a structure, the analog switches 71 to 76 turn on or off in accordance with 3-bit digital signals b2 to b0 ($\overline{b2}$ to $\overline{b0}$) and output analog signals $V_{DA}'$ which varies in the range between $V_{REF}$ and 0. Each D/A conversion part DA' performs D/A conversion in accordance with the output analog signal $V_{DA}'$.

Figure 4:
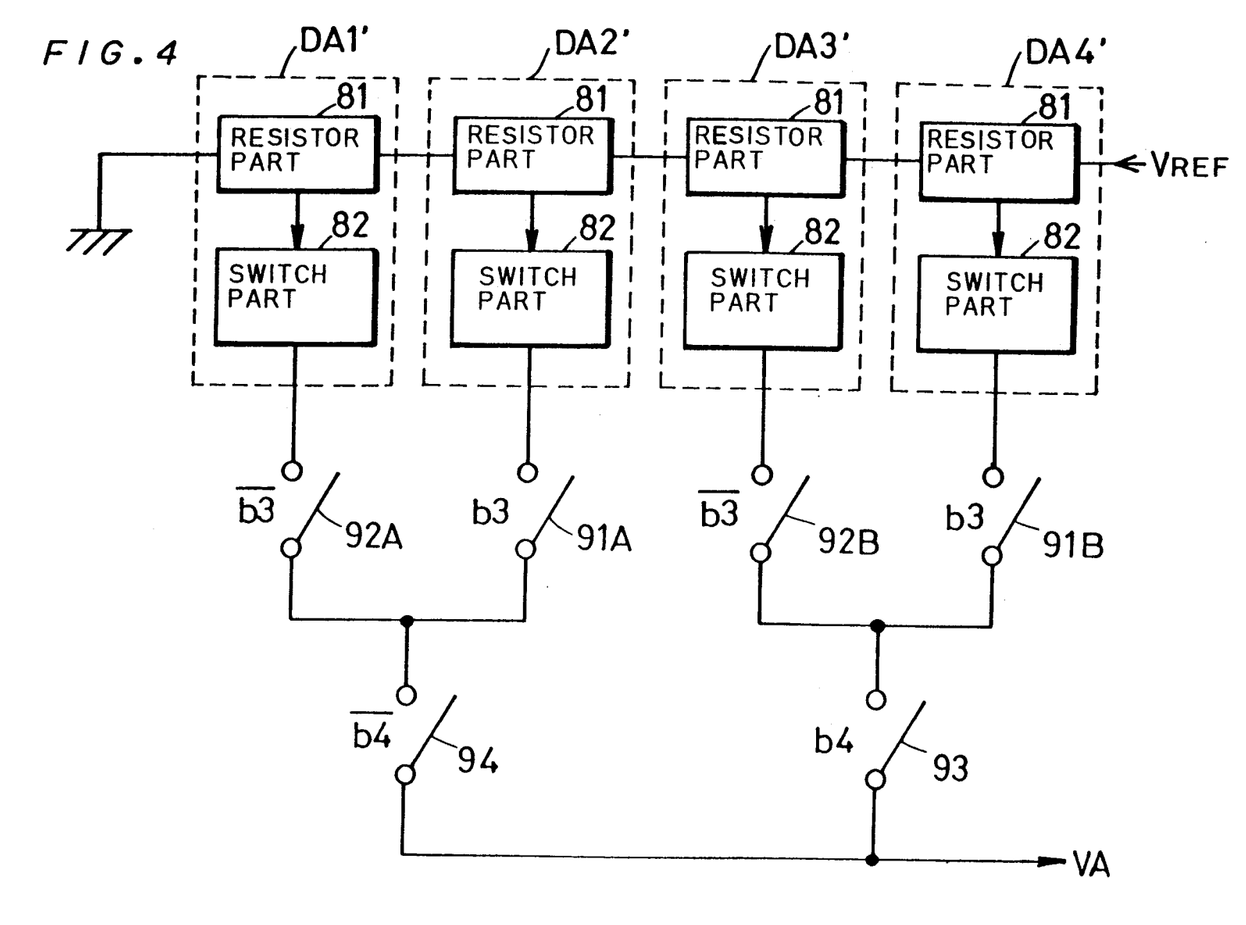
FIG. 4 is an explanatory diagram showing inner structure of a D/A convertor comprises the D/A conversion part of FIG. 4.

FIG. 4 is an explanatory diagram showing circuit structure of a D/A convertor comprising the D/A conversionparts DA1' to DA4' of the series resistance type (FIG. 3). As shown in FIG. 4, the resistor parts 81 of the respective D/A conversionparts DA1' to DA4' are connected in series. The analog signals from the swithch parts 82 are given to analog switches 92A, 91A, 92B and 91B. The analog swithces 92A ad 91A are connected commonly with an analog switch 94 while the analog switches 92B and 91B are connected commonly with an analog switch 93.

An analog switch (91A and 91B) turns on and off in accordance with a digital signal b3 while an analog switch (92A and 92B) turns on and off in accordance with a reverse digital signal $\overline{b3}$. The analog switch 93 turns on and off in accordance with a digital signal b4 while the analog switch 94 turns on and off in accordance with a reverse digital signal $\overline{b4}$. Outputted as an analog signal VA is a voltage obtained through turned on one of the analog switches 93 and 94.

In such a structure, the analog switches 92 to 94 turn on or off in accordance with the digital signals b4 and b3 ($\overline{b4}$ and $\overline{b3}$) while the analog switches 71 to 76 provided within each of the D/A conversion parts DA1' to DA4' (FIG. 3) turn on or off in accordance with the digital signals b2 to b0 ($\overline{b2}$ to $\overline{b0}$). Due to the function of the analog switches turned on or off, the analog signals VA which vary in the range between $V_{REF}$ and 0 is obtained in accordance with which D/A conversion is performed.

Althouth not illustrated, by arranging the D/A conversion parts DA1' to DA4' on a semiconductor chip in the symmetric arrangement similarly to the arrangement of the D/A conversion parts DA1 to DA4 of FIG. 1, an error included in the analog signal VA can be minimized.

While the invention has been described in detail in relation to only a few embodiments, the foregoing description is in all aspects illustrative and not restrictive. It is understood that numerous other modifications and variations can be devised without departing from the scope of the invention.

What is claimed is:

1. A D/A convertor for D/A converting digital signals to output an analog signal, comprising first to fourth D/A conversion parts each including a resistor part, analog outputs sequentially generated by said first to said fourth D/A conversion parts in accordance with said digital signals becoming full scale one after another, the sequence being the analog output of said first D/A conversion part first, that of said second D/A conversion part next, that of said third D/A conversion part, and finally that of said fourth D/A conversion part, said D/A convertor being characterized by an arrangement of said D/A conversion parts on a semiconductor chip such that said resistor parts of said first and third D/A conversion parts are arranged symmetric with respect to a first center line, said resistor parts of said first and fourth D/A conversion parts are arranged symmetric with respect to a second center line which crosses said first center line at right angles, said resistor parts of said second and third D/A conversion parts are arranged symmetric with respect to said second center line, and said first to fourth D/A conversion parts are closely arranged.

2. A D/A convertor in accordance with claim 1, wherein said first to fourth D/A conversion parts are the parallel resistance type.

3. A D/A convertor in accordance with claim 1, wherein said first to fourth D/A conversion parts are the serial resistance type.

* * * * *